Dec. 8, 1970 R. A. BEAUDETTE 3,546,596

ABSOLUTE VALUE AMPLIFIER CIRCUIT

Filed June 24, 1968

INVENTOR.
RICHARD A. BEAUDETTE
BY David M. Keay
AGENT 3,546,596

ABSOLUTE VALUE AMPLIFIER CIRCUIT

Richard A. Beaudette, Tewksbury, Mass., assignor to Sylvania Electric Products, Inc., a corporation of Delaware Filed June 24, 1968, Ser. No. 739,338
Int. Cl. H03k 5/00
U.S. Cl. 328—26 2 Claims

ABSTRACT OF THE DISCLOSURE

An operational amplifier, having differential outputs, is employed in combination with two feedback networks and two gates to yield a full-wave rectified output signal with gain.

BACKGROUND OF THE INVENTION

This invention relates to rectifier circuits and in particular to full-wave rectifiers useful, for example, in rectifying low level signals from a single-ended source.

The oldest and most commonly used technique of obtaining full-wave rectification from a single-ended source is by the use of a transformer in combination with two nonlinear diode elements. For many applications, transformers are not suitable because of their excessive weight and/or their limited frequency response.

Since the advent of integrated circuit-operational amplifiers, several full-wave rectifier circuits have been developed which eliminate the need for transformers. However, many of these circuits have disadvantages in low level signal operation because of the voltage drop losses across the diodes usually employed at the input or thresholding portion of the circuit.

SUMMARY OF THE INVENTION

An absolute value amplifier, a full-wave rectifier with gain, in accordance with the present invention, employs a differential amplifier, typically an operational-differential amplifier, having first and second input terminals and first and second output terminals. The second input terminal is connected to the second output terminal. A first series combination of a gate and feedback network connects the first output terminal to the first input terminal of the differential amplifier. Similarly, a second series combination of a gate and feedback network is connected between the second output terminal and the second input terminal of the differential amplifier. Each of the feedback networks have a second input terminal which is connected to an input terminal of the absolute value amplifier. Each of the gates has second output terminals which are connected together and constitute the output terminal of the absolute value amplifier.

An input signal, typically a sine wave, applied across the input terminals of the absolute value amplifier is directed through the feedback networks to the input terminals of the differential amplifier. During the positive half cycle, the output signals at the first and second output terminals of the differential amplifier are negative and positive respectively. This positive output signal is directed through the gate associated with the second output terminal of the differential amplifier to the output terminals of the absolute value amplifier and to the series connected feedback network to control the gain of the circuit during the positive half cycle. Similarly, when the input signal to the absolute value amplifier goes negative, the output signal at the first output terminal of the difference amplifier goes positive and is directed through its associated gate simultaneously to the output of the absolute value amplifier and to the feedback network associated with the gate to control the gain of the difference amplifier during the negative half cycle. Thus, full-wave rectification with gain is provided at the output terminals of the absolute value amplifier in response to a sinusoidal input signal.

DESCRIPTION OF THE DRAWINGS

The construction and operation of the apparatus according to the invention will be more fully understood from the following detailed description taken in conjunction with the drawings, in which.

DETAILED DESCRIPTION OF THE INVENTION

Figure 1:
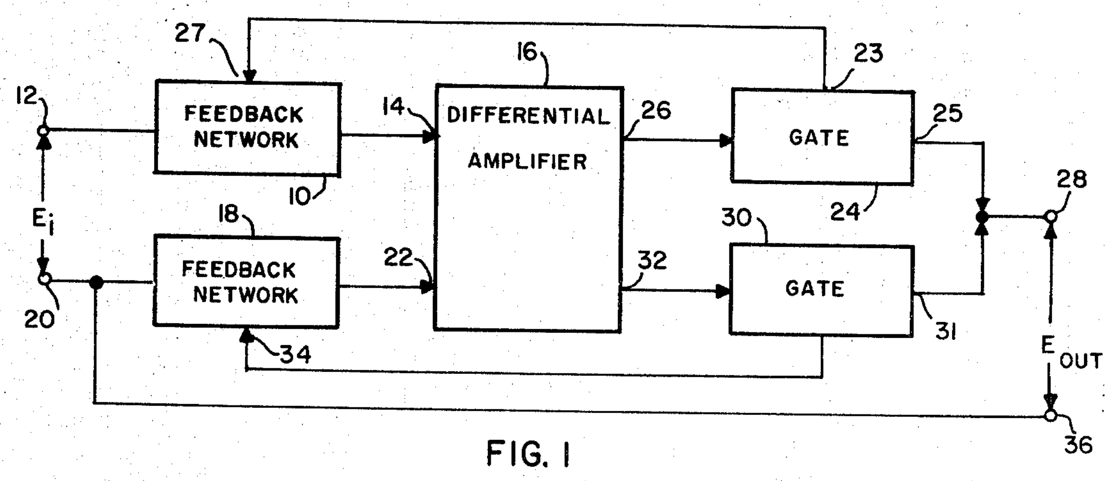
FIG. 1 is a block diagram of the absolute value amplifier according to the invention.

An absolute value amplifier according to the invention is illustrated in the block diagram of FIG. 1. A first feedback network 10 connects an input terminal 12 of the absolute value amplifier 7 to a first input terminal 14 of a differential amplifier 16, for example, an operational amplifier. Similarly, a second feedback network 18 connects a second input terminal 20 of the absolute value amplifier 7 to a second input terminal 22 of the differential amplifier 16. A first gate 24 has an input terminal connected to a first output terminal 26 of the differential amplifier 16 and has first and second output terminals 23 and 25, connected to a second input terminal 27 of feedback network 10 and to an output terminal 28 of the absolute value amplifier 7, respectively. A second gate 30 has an input terminal connected to a second output terminal 32 of the differential amplifier 16 and first and second output terminals 31 and 29 connected to a second input terminal 34 of feedback network 18 and to the output terminal 28 of the absolute value amplifier 7, respectively. The second input terminal and second output terminals 20 and 36, respectively, of the absolute value amplifier are connected together.

In operation, an input signal, for example, a sine wave, is applied across the input terminals 12 and 20 of the absolute valve amplifier. The input signal is directed through the feedback networks 10 and 34 to the input terminals 14 and 22, respectively, of the differential amplifier 16. When the input signal goes positive at terminal 14 with respect to terminal 22, the output signals at the terminals 26 and 32 of the differential amplifier 16 go negative and positive respectively. The positive output signal at terminal 32 is passed through the gate 30 simultaneously to the output terminal 28 of the absolute valve amplifier 7 and to the input terminal 34 of the feedback network 18. The feedback network 18 generates a control signal to adjust the gain of the differential amplifier 16 in response to a positive input signal at the input terminal 14 of the differential amplifier 16. The signal at the output terminal 26 of the differential amplifier 16 is negative in response to a positive signal at the input terminal 14. This negative signal closes the gate 24 which prevents the negative signal at terminal 26 from appearing either at the output terminal 28 of the absolute value amplifier 7 or at terminal 27 of the feedback network 10. Thus, a positive half of a sine wave input signal across the input terminals 12 and 20 will be reproduced with gain across terminals 28 and 36 of the absolute valve amplifier 7.

When the input sine wave across the input terminals 12 and 20 of the absolute value amplifier 7 traverses the negative half cycle, the signals appearing across the output terminals 26 and 32 of the differential amplifier 16 go positive and negative respectively. The negative signal at the second output terminal 32 of the differential amplifier 16 closes the gate 30 which prevents the negative signal from appearing either across the output terminals 28 and 36 of the absolute value amplifier 7 or at the second input terminal 34 of the second feedback network 18. The positive signal appearing at the first output terminal 26 of the differential amplifier 16 opens the first gate 24 and is directed simultaneously to the output terminal 28 of the absolute value amplifier and to the second input terminal 27 of the first feedback network 10 which adjusts the gain of the difference amplifier 16 and thus the amplitude of the second positive half cycle appearing across the output terminals 28 and 36 of the absolute value amplifier 7. Thus, for an input sine wave signal across the input terminals 12 and 20, full-wave rectification with gain is achieved across the output terminals 28 and 36 of the absolute value amplifier.

Figure 2:
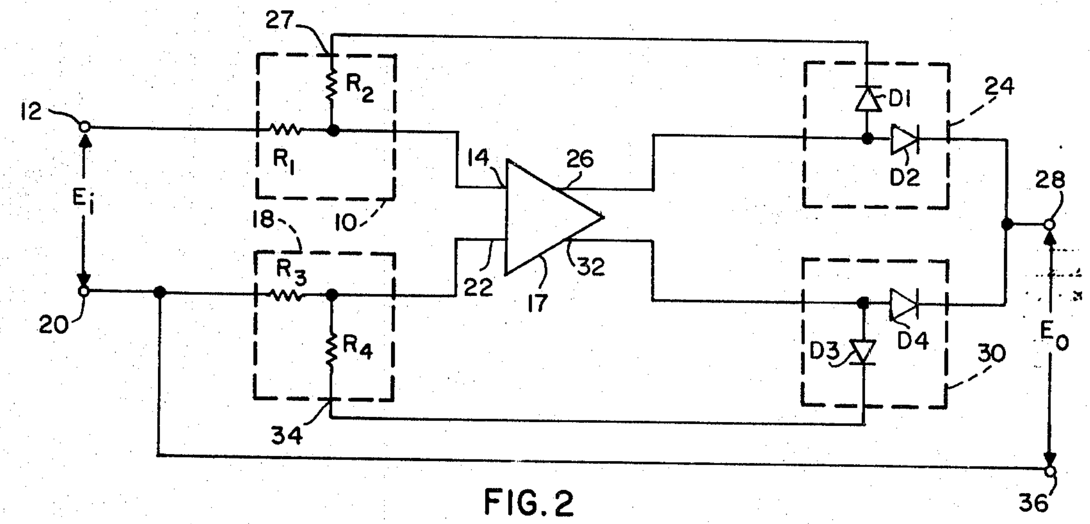
FIG. 2 is a schematic circuit diagram of the embodiment of FIG. 1.

Referring to FIG. 2, a detailed schematic diagram of the embodiment of FIG. 1 is shown. The first feedback network 10 employs first and second resistors $R_1$ and $R_2$. The first resistor $R_1$ connects the first input terminal 12 of the absolute value amplifier 7 to the first input terminal 14 of the differential amplifier 16, shown in FIG. 2 as a differential operational amplifier 17, for example, a Motorola MC1520. The second resistor $R_2$ connects the first terminal 14 of operation amplifier 17 to one end of a first diode D1 of the first gate 24. The other end of the first diode D1 is connected to the first output terminal 26 of the operational amplifier 17. A second diode D2 of the first gate 24 connects the first output terminal 26 of the operational amplifier 17 to the first output terminal 28 of the absolute value amplifier 7.

Similarly, the second feedback network 18 employs first and second resistors $R_3$ and $R_4$. The first resistor $R_3$ connects the second input terminal 20 of the absolute value amplifier 7 to the second input terminal 22 of the operational amplifier 17. The second resistor $R_4$ of the second feedback network 18 connects the second terminal 22 of the operational amplifier 17 to one end of a first diode D3 of the second gate 30. The other end of the first diode D3 is connected to the second output terminal 32 of the operational amplifier 17. A second diode D4 of the second gate 30 connects the second output terminal 32 of the operational amplifier 17 to the first ouput terminal 28 of the absolute value amplifier 7.

The operation of the absolute value amplifier is such that when a sinusoidal input signal across the input terminals 12 and 20 traverses the positive half cycle, the operational amplifier output signals at the terminals 26 and 32 go negative and positive respectively. The negative signal at the first output terminal 26 of the operational amplifier back biases the first and second diodes D1 and D2 of the first gate 24, and, therefore, no signal is directed through the first gate 24. However, the signal at the second output terminal goes positive and is directed simultaneously to the output terminal 28 of the absolute value amplifier and to the second feedback network 18. The gain, $$\frac{E_0}{E_1}$$

of the absolute value amplifier during the positive half cycle of the input signal is determined by the expression $$\frac{E_0}{E_1}=1+\frac{R_4}{R_3} \quad (1)$$

When the output signal traverses the negative half cycle, the output signal at the second output terminal 32 of the operational amplifier 17 goes in a negative direction back biasing the first and second diodes D3 and D4 of the second gate 30. Simultaneously, the signal at the first output terminal 26 of the operational amplifier 17 goes in a positive direction and is directed to both the first output terminal 28 of the absolute value amplifier and the first feedback network 27. The gain of the absolute amplifier 7 during the negative half cycle to the input signal is determined by the expression $$\frac{E_0}{E_1}=\frac{R_2}{R_1} \quad (2)$$

As indicated by the Equations (1) and (2), the gain of the absolute value amplifier can be independently controlled for each half cycle of the input signal by adjusting the ratio of resistor values in the appropriate feedback network.

Figure 3:
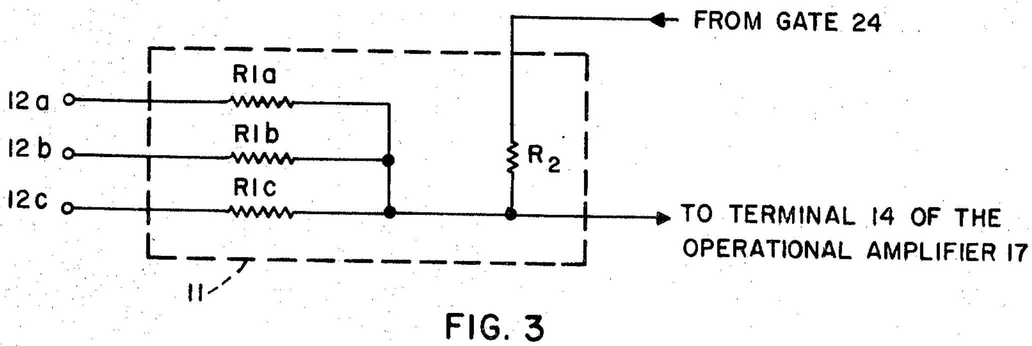
FIG. 3 is a schematic diagram of a modified feedback network which may be substituted for a feedback network employed in the embodiment of FIG. 2.

The junction of the first and second resistors $R_1$ and $R_2$ can be used as a summing point for a number of input signals of different polarities and amplitudes to yield a composite output signal of a constant amplitude. FIG. 3 is a schematic representation of a modified feedback network that may be substituted for the feedback network 11 in the apparatus of FIG. 2 as a summing circuit. A plurality of resistors R1*a*–R1*c* connect respective input terminals 12*a*–12*c* to the first input terminal 14 of the operational amplifier 16. The plurality of resistors provides a summing means whereby signals of varying polarity and amplitude are added to form a composite signal which operates the absolute value amplifier in a manner described hereinabove.

While there has been shown and described what is considered a preferred embodiment of the present invention, it will be obvious to those skilled in the art that various modifications and changes may be made therein without departing from the invention as defined by the appended claims.

What is claimed is:

1. Apparatus for providing a single polarity output signal in response to an input signal, said apparatus comprising:

first and second input terminals and first and second output terminals, said second input terminal being connected to one of said output terminals;

an amplifier having first and second input terminals and first and second output terminals, said amplifier being operative in response to an input signal of one polarity to provide a first output signal of the same polarity at the first output terminal of said amplifier and to provide a second output signal of the opposite polarity at the second output terminal of said amplifier;

first and second gates each having an input terminal and first and second output terminals, the input terminal of said first and second gates being connected to the first and second output terminals, respectively, of said amplifier, and the first output terminals of said first and second gates being connected to the first output terminal of said apparatus, said first and second gates each being operative to pass a signal of predetermined polarity; and first and second feedback networks each having first and second input terminals and an output terminal, the first input terminals of said first and second feedback networks being connected to the first and second input terminals, respectively, of said apparatus, the second input terminal of said first feedback network being connected to the second output terminal of said first gate, the second input terminal of said second feedback network being connected to the second output terminal of said second gate, and the output terminals of said first and second feedback networks being connected to the first and second input terminals, respectively, of said amplifier, said first and second feedback networks being operative to combine an input signal across the first and second input terminals of said apparatus with a signal received from the respective first and second gates to control the gain of said amplifier, wherein each of said first and second gates comprises first and second diodes, the anodes of which are connected to the input terminals of the gate and the cathodes of which are connected, respectively, to the first and second output terminals of the gate, said first and second diodes being operative to pass input signals of positive polarity, and wherein each of said first and second feedback networks includes first and second resistors connected in series between the first and second input terminals of the feedback network and the common juncture of the series-connected resistors being connected to the output terminal of its associated feedback network, said first and second resistors being operative to furnish at the output terminal of the associated feedback network a ratio of the input signals at said first and second input terminals of said feedback network.

2. Apparatus for providing a single polarity output signal according to claim 1 wherein said first feedback network comprises a plurality of first resistors and a second resistor, each of said plurality of first resistors having one end connected to one end of said second resistor and the other end connected to separate terminals of the plurality of said first input terminals, said second resistor having the other end connected to the second input terminal of said first feedback network.

References Cited

UNITED STATES PATENTS 2,822,474 2/1958 Boecker ------------- 328—26

ROY LAKE, Primary Examiner

J. B. MULLINS, Assistant Examiner

U.S. Cl. X.R.

307—230, 259, 261,